United States Patent
Ito et al.

(10) Patent No.: US 6,770,413 B1
(45) Date of Patent: Aug. 3, 2004

(54) HYDROXYPHENYL COPOLYMERS AND PHOTORESISTS COMPRISING SAME

(75) Inventors: Hiroshi Ito, San Jose, CA (US); Ashish Pandya, Natick, MA (US); Roger F. Sinta, Woburn, MA (US)

(73) Assignee: Shipley Company, L.L.C., Marlborough, MA (US)

( * ) Notice: Subject to any disclaimer, the term of this patent is extended or adjusted under 35 U.S.C. 154(b) by 0 days.

(21) Appl. No.: 09/228,694

(22) Filed: Jan. 12, 1999

(51) Int. Cl.$^7$ .............................. G03C 1/73; G03F 7/039
(52) U.S. Cl. ................... 430/270.1; 430/910; 430/914; 430/326; 526/329.2
(58) Field of Search ............................. 526/329.2, 313; 522/153, 154, 31, 63, 67, 68; 430/914, 910, 270.1, 271.1, 326

(56) References Cited

U.S. PATENT DOCUMENTS

| | | | |
|---|---|---|---|
| 4,491,628 A | 1/1985 | Ito et al. ..................... | 430/176 |
| 5,362,600 A | 11/1994 | Sinta et al. .................. | 430/192 |
| 5,492,793 A | 2/1996 | Breyta et al. ............. | 430/270.1 |
| 5,844,057 A | * 12/1998 | Watanabe et al. ............ | 526/313 |

FOREIGN PATENT DOCUMENTS

| | | |
|---|---|---|
| EP | 0 440 374 A2 | 8/1991 |
| EP | 0 596 668 | 5/1994 |
| EP | 0 663 616 A2 | 7/1995 |
| EP | 0 780 732 | 6/1997 |
| EP | 0 813 113 | 12/1997 |
| JP | 06049137 A * | 2/1994 |

OTHER PUBLICATIONS

Watanabe et al JPO Abstract JP406049137A–English Abstract of JP 06049137A (File:JPAB), Feb. 22, 1994.*
Watanabe et al Derwent Abstract:1994–097835–English Abstract of JP 06049137A (File; DWPI), Feb. 22, 1994.*
Derwent Publications Ltd., London, GB; Database WPI, Section Ch, Week 199412, AN 1994–097835, XP002135741 & JP 06 049137 A (Shinetsu Chem Ind Co Ltd.), Feb. 22, 1994 *abstract*.

* cited by examiner

Primary Examiner—Mark F. Huff
Assistant Examiner—Sin J. Lee
(74) Attorney, Agent, or Firm—Peter F. Corless; Darryl P. Frickey; Edwards & Angell, LLP

(57) ABSTRACT

The present invention relates to new copolymers and use of such copolymer as a resin binder component for photoresist compositions, particularly chemically-amplified positive-acting resists. Polymers of the invention include repeat units of 1) meta-hydroxystyrene groups, 2) para-hydroxystyrene groups, and 3) photoacid-labile groups.

10 Claims, No Drawings

US 6,770,413 B1

HYDROXYPHENYL COPOLYMERS AND PHOTORESISTS COMPRISING SAME

BACKGROUND OF THE INVENTION

1. Field of the Invention

The present invention relates to new copolymers and use of such copolymers as a resin binder component for photoresist compositions, particularly chemically-amplified positive-acting resists. Polymers of the invention include 1) photoacid-labile groups, 2) meta-hydroxphenyl groups, and 3) para-hydroxyphenyl groups.

2. Background

Photoresists are photosensitive films used for the transfer of images to a substrate. A coating layer of a photoresist is formed on a substrate and the photoresist layer is then exposed through a photomask to a source of activating radiation. The photomask has areas that are opaque to activating radiation and other areas that are transparent to activating radiation. Exposure to activating radiation provides a photoinduced chemical transformation of the photoresist coating to thereby transfer the pattern of the photomask to the photoresist-coated substrate. Following exposure, the photoresist is developed to provide a relief image that permits selective processing of a substrate.

A photoresist can be either positive-acting or negative-acting. For most negative-acting photoresists, those coating layer portions that are exposed to activating radiation polymerize or crosslink in a reaction between a photoactive compound and polymerizable reagents of the photoresist composition. Consequently, the exposed coating portions are rendered less soluble in a developer solution than unexposed portions. For a positive-acting photoresist, exposed portions are rendered more soluble in a developer solution while areas not exposed remain comparatively less developer soluble. In general, photoresist compositions comprise at least a resin binder component and a photoactive agent.

More recently, chemically-amplified-type resists have been increasingly employed, particularly for formation of sub-micron images and other high performance applications. Such photoresists may be negative-acting or positive-acting and generally include many crosslinking events (in the case of a negative-acting resist) or deprotection reactions (in the case of a positive-acting resist) per unit of photogenerated acid. In the case of positive chemically-amplified resists, certain cationic photoinitiators have been used to induce cleavage of certain "blocking" groups pendant from a photoresist binder, or cleavage of certain groups that comprise a photoresist binder backbone. See, for example, U.S. Pat. Nos. 5,075,199; 4,968,581; 4,883,740; 4,810,613; and 4,491,628, and Canadian Patent Application 2,001,384. Upon cleavage of the blocking group through exposure of a coating layer of such a resist, a polar fictional group is formed, e.g., carboxyl or imide, which results in different solubility characteristics in exposed and unexposed areas of the resist coating layer. See also R. D. Allen et al., *Proceedings of SPIE*, 2724:334–343 (1996); and P. Trefonas et al. *Proceedings of the 11$^{th}$ International Conference on Photopolymers (Soc. Of Plastics Engineers)*, pp 44–58 (Oct. 6, 1997).

While currently available photoresists are suitable for many applications, current resists also can exhibit significant shortcomings, particularly in high performance, applications such as formation of highly resolved sub-half micron and sub-quarter micron features.

SUMMARY OF THE INVENTION

The present invention provides novel copolymers and photoresist compositions that comprise a photoactive component and such copolymers as a resin binder component. The copolymers of the invention in general comprise at least one repeating unit that is a meta-hydroxyphenyl derivative, at least one repeating unit that is a para-hydroxyphenyl derivative and one or more photoacid-labile groups.

We have found that resists that contain a resin of the invention can exhibit excellent properties thereby enabling formation of highly resolved resist images. Resists that have too high of a dissolution rate can exhibit relatively decreased resolution, particularly when printing micron or sub-micron features. It has been particularly found that addition of a meta-hydroxyphenyl unit to a polymer containing para-hydroxy and acid labile units can quite favorably impact solubility differentials between exposed and unexposed regions of a resist coating layer that contains the polymer.

Particular preferred copolymers of the invention include units provided by polymerization of a meta-hydroxy vinylphenyl compound (such as meta-hydroxy styrene or meta-hydroxy a-methylstyrene), para-hydroxystyrene (such as para-hydroxy styrene or para-hydroxy α-methylstyrene) and an acrylate ester to provide photoacid-labile groups. Polymers of the invention also may contain other units, such as optionally phenyl groups (e.g. as may be provided by copolymerization of a styrene compound), cyano (as may be provided by provided by copolymerization of acrylonitrile), etc.

The invention also provides method for forming relief images, including methods for forming a highly resolved relief image such as a pattern of lines where each line has essentially vertical sidewalls and a line width of about 0.40 microns of less, or even about 0.25 microns or less. The invention further provides articles of manufacture comprising substrates such as a microelectronic wafer or a liquid crystal display or other flat panel display substrate having coated thereon the photoresists and relief images of the invention.

Unless otherwise indicated, the term "copolymer" refers herein to polymers other than homopolymers, and thus includes terpolymers, tetrapolymers, etc. Additionally, references herein to "meta-hydroxyphenyl" groups or "parahydroxyphenyl" groups or other similar terms are inclusive of groups that may have phenyl ring substituents in addition to a hydroxy group at the specified position. Generally preferred meta-hydroxyphenyl groups of copolymers of the invention do not have hydroxy substitution at the para position, and more preferably only have a single hydroxy substitution at a meta position. Generally preferred para-hydroxyphenyl groups of copolymers of the invention do not have hydroxy substitution at a meta position, and more preferably only have a single hydroxy substitution at the para position.

Other aspects of the invention are disclosed infra.

DETAILED DESCRIPTION OF THE INVENTION

As discussed above, preferred copolymers of the invention include at least three distinct repeating units of 1) units that contain acid-labile groups; 2) units that contain meta-hydroxy phenyl groups such as provided by condensation of meta-hydroxystyrene or meta-hydroxy α-methylstyrene; and 3) units that contain para-hydroxy phenyl groups such as provided by condensation of para-hydroxystyrene or para-hydroxy α-methylstyrene. The polymers also optionally may include other groups 4) as desired.

Copolymer units 1) are acid labile groups that will undergo photoacid induced cleavage upon exposure of a coating layer of a photoresist containing the polymer to provide solubility differentials between exposed and unexposed coating layer regions. As referred to herein, the terms acid-labile groups or photoacid-labile groups are used in accordance with their art-recognized meanings of such groups that are capable of undergoing photoacid-induced cleavage to provide solubility differentials between exposed and unexposed of regions of a resist coating layer that contains a polymer with the labile units.

Acid labile groups 1) are preferably pendant to the polymer backbone. Acrylate groups are generally preferred and can be formed by polyaddition or other reaction of monomers of one or more substituted or unsubstituted alkyl acrylates such as t-butylacylate and t-butylmethacrylate. Suitable monomers are commercially available or can be readily prepared by known procedures. The pendant substituted ester moiety of the condensed acrylate unit, i.e. R—O—C(=O)—, serves as the pendant acid labile groups. A wide variety of acrylate units may be employed including those having an ester group (group R above) that is a non-cyclic or cyclic alkyl having 1 to about 14 carbon atoms, more typically 1 to about 8 carbons. Also suitable will be such alkyl ester groups that have one or more substituents such as halogen, particularly F, Cl or Br, $C_{1-6}$ alkoxy, aryl such as phenyl, etc. Exemplary compounds that may be condensed to provide acrylate units of the polymers of the invention include butylacrylate including t-butylacrylate, butylmethacrylate including t-butylmethacrylate, etc. Suitable acrylate acid-labile groups also include those of the formula $R^3O(C=O)R^2R^1C$— where $R^1$ and $R^2$ are each independently selected from the group of hydrogen, substituted or unsubstituted $C^{1-10}$ alkyl or an electron-withdrawing group such as halogen; and $R^3$ is substituted or unsubstituted $C_{1-14}$ alkyl, substituted or unsubstituted aryl such as phenyl or substituted or unsubstituted aryalkyl such as benzyl. The substituents of substituted groups can be, e.g., halogen, $C_{1-6}$ alkyl, $C_{1-6}$ alkoxy, phenyl or other aryl, etc. Such acetate groups may be provided as described above for acrylate groups, i.e., by free radical or other reaction of monomers of one or more substituted or unsubstituted vinyl acetates such as allyl acetate and the like. Other suitable acid labile groups include those disclosed e.g. in U.S. Pat. Nos. 5,362,600; 4,968,581; 4,883,740; 4,810,613; and 4,491,628.

Copolymers of the invention also include meta-hydroxyphenyl groups 2), and para-hydroxyphenyl groups 3). Those groups 2) and 3) may be provided e.g. by polymerization of corresponding monomers such as optionally substituted meta-hydroxystyrene, meta-hydroxy α-methylstyrene, para-hydroxystyrene or para-hydroxy α-methylstyrene. Generally preferred meta-hydroxyphenyl groups 2), and para-hydroxyphenyl groups 3) contain only a single hydroxy substitution, and are either unsubstituted by non-hydrogen groups or are optionally substituted by groups other than reactive (such as photoacid-labile groups) or acidic groups such as carboxy and the like. For instance, suitable optional non-reactive and non-acidic ring substituents include halogen, $C_{1-6}$ alkoxy, $C_{1-6}$ and the like. References herein to such "non-reactive groups" means that the groups will not react with acid or thermally (generally less than about 170° C.) under typical lithographic processing (pre-exposure, exposure, post-exposure bake and development steps) of a photoresist containing the polymer.

As discussed above, copolymers of the invention may optionally comprise other units in addition units that 1), 2) and 3). For example, copolymers of the invention may contain units 4) that are free of reactive (such as photoacid-labile groups) or acidic groups such as hydroxy (such as present from phenolic groups), carboxy and the like. In accord with the above discussion, references herein to such additional units 4) that "are free of reactive groups" means the groups will not react with acid or thermally (generally less than about 170° C.) under typical lithographic processing (pre-exposure, exposure, post-exposure bake and development steps) of a photoresist containing the copolymer.

Optionally substituted phenyl groups are particularly preferred additional units 4) and may be provided by reaction of optionally substituted styrene groups, where such optional substituents are non-reactive groups such as halogen, alkoxy, alkyl, etc. ring substituents. Other preferred additional copolymer units 4) include those that have a high carbon content, e.g. units where at least about 75 percent of a unit's total mass is carbon, more preferably where at least about 80 or even at least 90 percent of the unit's total mass is carbon. In addition to optionally substituted phenyl, specifically preferred groups include substituted and unsubstituted aryl groups. e.g. groups having about 6 to 18 aromatic carbons such as groups provided by condensation of naphthylene, acenaphthylene, etc. as well as optionally substituted vinyl alicyclic groups including those having 5 to about 12 carbon atoms such as substituted or unsubstituted vinyl norbornyl, vinyl adamantyl or vinyl cyclohexane. Non-cyclic optionally substituted alkyl groups also may be employed, e.g. having 1 to about 12 carbon atoms, but are generally less preferred than aryl or alicyclic groups. Suitable substituents of optionally substituted groups include e.g. $C_{1-8}$ alkoxy, particularly methoxy; ethoxy; propoxy; cyano; halogen (F, Cl, Br or I); alkynyl having 2 to about 10 carbon atoms; alkylthio having 1 to about 10 carbon atoms; and the like. As mentioned above, however, these additional optional units preferably are not substituted by acidic moieties such as hydroxy, carboxy, etc. or photoacid-labile moieties such as an acid labile ester.

Preferred copolymers of the invention include those that comprise a structure of the following Formula I:

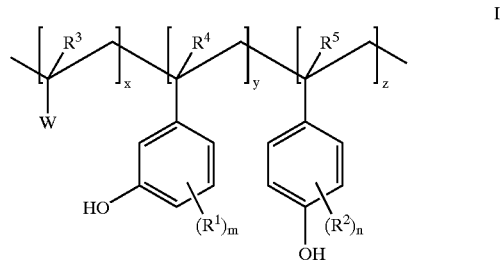

I wherein W is a unit that comprises a photoacid-labile group;

$R^1$ and $R^2$ are each the same or different non-hydrogen substituents;

$R^3$, $R^4$ and $R^5$ are each independently hydrogen or optionally substituted alkyl;

m and n are each independently 0 (where each available phenyl ring position is hydrogen-substituted) to 4;

x, y and z are each greater than 0 and are the mole fractions or percents of the respective polymer units, based on total units of the polymer.

As discussed above, preferred photoacid-labile groups W are acrylate groups, to provide polymers that comprise a structure of the following Formula II:

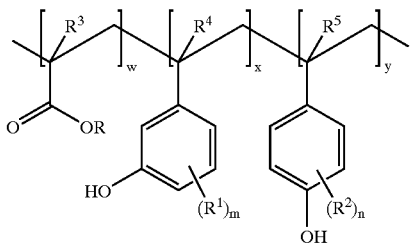

wherein R is an optionally substituted alkyl, preferably having about 4 to about 12 carbon atoms, more typically about 4 to about 6 carbons, with branched non-cyclic groups such as tert-butyl and alicyclic groups such as adamantyl, tetrahydropyranyl and norbornyl;

w, x and y are each greater than 0 and are the mole fractions or percents of the respective polymer units, based on total units of the polymer; and $R^1$, $R^2$, $R^3$, $R^4$, $R^5$, m, n, are each the same as defined above in Formula I.

As further discussed above, preferred polymers of the invention also include those that contain additional repeat units, particularly groups that do not contain acidic (e.g. hydroxy (such as present from phenolic groups), carboxy) or acid-reactive (e.g. photoacid-labile moieties) groups. More specifically, preferred polymers of the invention include those that comprise a structure of the following Formula III:

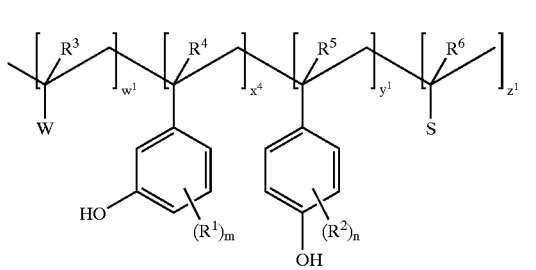

wherein W, $R^1$, $R^2$, $R^3$, $R^4$, $R^5$, m and n are each the same as defined in Formula I above; $R^6$ is the same as defined for $R^3$, $R^4$ and $R^5$ in Formula I;

S is a group that does not contain acidic or reactive moieties;

w', x', y' and z' are each greater than 0 and are the mole fractions or percents of the respective polymer units, based on total units of the polymer.

A particularly preferred copolymer of the invention comprises a structure of the following Formula IV:

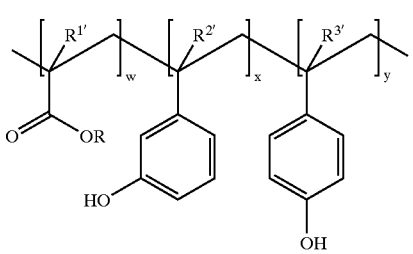

wherein R is optionally substituted alkyl suitably having from 4 to about 18 carbon atoms, and preferably is a branched non-cyclic group such as tert-butyl group or is an alicyclic groups such as adamantyl, tetrahydropyranyl, or norbornyl;

$R^{1'}$, $R^{2'}$ and $R^{3'}$ are each independently hydrogen or methyl;

w, x and y are each greater than 0 and are mole fractions or percents of the respective units based on total units of the polymer, and preferably the sum of w, x and y is at least about 70 percent, more preferably at least about 80, 85, 90 or 95 percent, and still more preferably the sum of w, x, and y is 100 percent.

Suitable W groups in Formulae I and III above may be a wide variety of groups, including the acid-labile groups discussed above with respect to units 1). In Formula II, preferred R groups are optionally substituted alkyl preferably having about 4 to about 10 carbon atoms, more typically about 4 to about 8 carbons. Branched alkyl such as tert-butyl are generally preferred R groups. Also the polymer may comprise a mixture of different W or R groups, e.g. by using a varying acrylate monomers during the polymer synthesis.

Typical $R^1$ and $R^2$ groups in Formulae I–III above include, e.g., halogen (particularly F, Cl or Br); $C_{1-8}$ alkyl; $C_{1-8}$ alkoxy; $C_{2-8}$ alkenyl: $C_{2-8}$ alkenyl or alkynyl, aryl such as phenyl; alkanoyl such as a $C_{1-6}$ alkanoyl of acyl and the like; etc. Generally less preferred $R^1$ and $R^2$ groups are acidic or reactive groups such as, e.g., hydroxy, carboxy, —COOH or other group that may react with photoacids such as esters.

$R^3$, $R_4$, $R^5$ and $R^6$ in any of Formulae I–IV typically are $C_{1-4}$ alkyl or hydrogen, more typically methyl or hydrogen.

Suitable S groups of copolymers of Formula III include e.g. aromatic groups such as phenyl, naphthyl and the like; alicyclic groups such as adamantyl, norbornyl and the like. In general, the groups discussed above as optional units 4) are suitable units S. Phenyl optional substituted with non-reactive groups (e.g. halogen, alkoxy, alkyl, etc.) is a generally preferred S group. Such a phenyl S group may be provided by reaction of styrene units. Such S groups may be suitably present in an amount of from about 1 to about 50 mole percent of total units of the polymer, more typically from about3 to about 30 mole percent of total units of the, polymer, still more typically from about 5 to about 20 or 25 mole percent of total units of the polymer.

The above-mentioned optionally substituted groups (including R, $R^1$, $R^2$, $R^3$, $R^4$, $R^5$, and $R^6$) may be substituted at one or more available positions by one or more suitable groups such as halogen (particularly F, Cl or Br); $C_{1-8}$ alkyl; $C_{1-8}$ alkoxy; $C_{2-8}$ alkenyl: $C_{2-8}$ alkenyl or alkynyl, aryl such as phenyl; alkanoyl such as a $C_{1-6}$ alkanoyl (e.g. acetyl) and the like; etc. Typically a substituted moiety is substituted at one, two or three available positions.

In the above Formulae I, II, III and IV, the specified mole fractions or percent may suitably vary over relatively wide ranges. For example, in each of those formulae, x, w or w' (mole percents of acid-labile groups) may be suitably 1 to about 90 mole percent of total units of the copolymer, more typically about 5 to about 80 mole percent of total units of the copolymer; and the mole percents of the meta-hydroxyphenyl units (y in Formula I; x or x' in the other formulae) and para-hydroxyphenyl units (z in Formula I; y or y' in the other formulae) each may be suitably about 5 or 10 to about 50 mole percent of total units of the copolymer, more typically about 15 or 20 to about 40 mole percent of total units of the copolymer; and in Formula III, z' may be from about 1 to about 70 or 80 mole percent of total units of the copolymer, more typically about 5 or 10 mole percent to about 30, 40, 50 or 60 mole percent of total units of the copolymer. It is often preferred that meta-hydroxyphenyl units are present in a copolymer in a greater molar amount than para-hydroxyphenyl units.

In particularly preferred aspects of the invention, in the above Formulae I through IV, mole percents of the specified units will be as follows: acid-labile units (x in Formula I; w or w' in other formulae) will be from about 3 to about 50 mole percent of total units of the copolymer, more preferably from about 4 to about 30 mole percent of total units of the copolymer, still more preferably from about 5 to about 25 mole percent, even more preferably from about 8 to about 20 mole percent of total units of the copolymer; meta-hydroxyphenyl units (y in Formula I; x or x' in the other formulae) will be from about 40 to about 90 mole percent of total units of the copolymer, more preferably from about 50 to about 85 mole percent, still more preferably from about 60 to about 70 or 75 mole percent of total units of the copolymer; para-hydroxyphenyl units (z in Formula I; y or y' in the other formulae) will be from about 5 to about 40 mole percent of total units of the copolymer, more preferably from about 8 to 35 mole percent, still more preferably from about 10 to about 20 or 25 mole percent of total units of the copolymer.

It is generally preferred that the groups depicted in the above Formulae I, II, III and IV constitute the major portion of the polymer. More specifically, in Formulae I it is preferred that the sum of x, y and z is at least about 60 mole percent of total units of the polymer, more preferably at least about 70 or 80 percent, still more preferably the sum of w, x and y is at least about 90 or 95 mole percent of total units of the polymer. In many instances, it is particularly preferred that a polymer only contain the depicted acid-labile and meta- and para-hydroxyphenyl units, i.e. that the sum of x, y and z equals 100 percent in Formula I. Similarly, for Formulae III, it is preferred that the sum of w', x', y' and z' is at least about 60 percent of total units of the polymer, more preferably at least about 70 or 80 percent, still more preferably the sum of w', x', y' and z' is at least about 90 or 95 mole percent of total units of the polymer. Again, in many instances, it is particularly preferred that a copolymer of Formula III only contains the depicted acid labile groups, meta- and para-hydroxyphenyl units, and non-acidic/non-reactive groups S, i.e. that the sum of w', x', y' and z' equals about 100 percent in Formula III. Again, similarly, for each of Formulae II and IV, it is preferred that the sum of w, x and y is at least about 60 mole percent of total units of the polymer, more preferably at least about 70 or 80 percent, still more preferably the sum of w, x and y is at least about 90 or 95 mole percent of total units of the polymer. In many instances, it is particularly preferred that a polymer only contain the depicted acid-labile and meta- and para-hydroxyphenyl units, i.e. that the sum of w, x and y equals 100 percent in each of Formulae II and IV.

Polymers of the invention can be prepared e.g. by free radical polymerization, e.g. by reaction of a plurality of monomers to provide the various units as discussed above in the presence of a radical initiator under an inert atmosphere (e.g., $N_2$ or argon) and at elevated temperatures such as about 70° C. or greater, although reaction temperatures may vary depending on the reactivity of the particular reagents employed and the boiling point of the reaction solvent (if a solvent is employed). See Example 1 which follows for exemplary reactions conditions. Suitable reaction temperatures for any particular system can be readily determined empirically by those skilled in the art based on the present disclosure.

A reaction solvent may be employed if desired. Suitable solvents include alcohols such as propanols and butanols and aromatic solvents such as benzene, chlorobenzene, toluene and xylene. Dimethyl sulfoxide and dimethylformamide are also suitable. The polymerization reaction also may be run neat.

A variety of free radical initiators may be employed to prepare the copolymers of the invention. For example, azo compounds may be employed such as azo-bis-2,2'-isobutyronitrile (AIBN) and 1,1'-azo-bis (cyclohexanecarbonitrile). Peroxides, peresters, peracids and persulfates also can be employed.

Monomers that contain hydroxy (such as m-hydroxystyrene or p-hydroxystyrene) or other reactive moieties may be condensed in "masked" form if desired to facilitate polymer synthesis. For example meta-acetoxystyrene and para-acetoxystyrene may be employed as "masked" forms of meta-hydroxystyrene and para-hydroxystyrene respectively. Other hydroxy masking or protecting groups also will be suitable such as alkylsilyl groups (to form silylethers with the hydroxy moiety), e.g. $(CH_3)_3Si$—, $(CH_3)_2(butyl)Si$—, $((CH_3)_3C)_3Si$—, etc.; other alkyl esters, e.g. $CH_3CH_2C(=O)$—, etc. After reaction completion, the masking groups may be removed under basic conditions. For example, the formed polymer may be heated in the presence of a base such as $NH_4OH$ or $NH_4OAc$. See Example 1 which follows for exemplary conditions.

The monomers also may be suitably directly reacted, i.e. in "unmasked" form, by e.g. polymerization of meta-hydroxystyrene, para-hydroxystyrene, and a monomer that includes a photoacid-labile group, such as tert-butylacrylate, tert-butylmethacrylate and the like.

Generally preferred copolymers of the invention may have a weight average molecular weight (Mw) of 1,000 to about 100,000, more preferably about 2,000 to about 30,000, even more preferably an Mw of about 5,000 or 8,000 to about 25,000 or 30,000, suitably with a molecular weight distribution (Mw/Mn) of about 3 or less, more preferably a molecular weight distribution of about 2 or less. Molecular weights (either Mw or Mn) of the polymers of the invention are suitably determined by gel permeation chromatography. Suitable molecular weight distributions of copolymers of the invention include from about 1 to 5, more typically from about 1 to 3 or 4. It has been found that dissolution rates in aqueous tetramethylammonium hydroxide solutions decrease with increasing Mw of copolymers of the invention.

As discussed above, the copolymers of the invention are highly useful as the resin binder component in photoresist compositions, particularly chemically-amplified positive resists. Photoresists of the invention in general comprise a photoactive component and a resin binder component that comprises the above-described copolymer.

The resin binder component: should be used in an amount sufficient to render a coating layer of the resist developable with an aqueous alkaline developer.

The resist compositions of the invention also comprise a photoacid generator (i.e. "PAG") that is suitably employed in an amount sufficient to generate a latent image in a coating layer of the resist upon exposure to activating radiation.

One group of preferred PAGs for use in the resists of the invention include imidosulfonates such as compounds of the following formula:

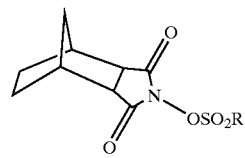

wherein R is camphor, adamantane, alkyl (e.g. $C_{1-12}$ alkyl) and perfluoroalkyl such as perfluoro($C_{1-12}$ alkyl), particularly perfluoro anions of perfluorooctanesulfonate, perfluorononanesulfonate and the like. A specifically preferred PAG is N-[(perfluorooctanesulfonyl)oxy]-5-norbornene-2,3-dicarboximnide.

Other sulfonate compounds also may be employed such as sulfonate salts. Two suitable agents are the following PAGs 1 and 2:

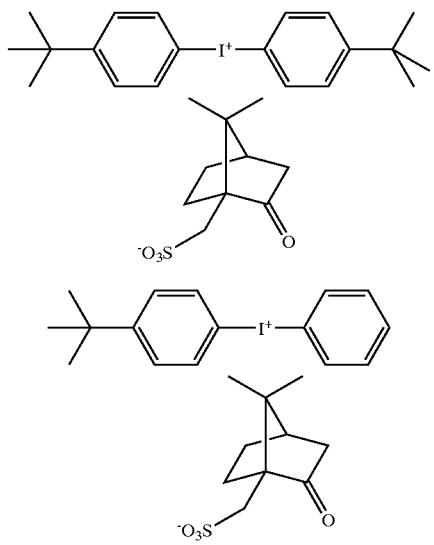

Such sulfonate compounds can be prepared as disclosed in European Patent Application 96118111.2 (publication number 0783136), which details the synthesis of above PAG 1.

Also suitable are the above two iodonium compounds complexed with anions other than the above-depicted groups. In particular, preferred anions include those of the formula $RSO_3^-$ where R is adamantane, alkyl (e.g. $C_{1-12}$ alkyl) and perfluoroalkyl such as perfluoro ($C_{1-12}$ alkyl), particularly perfluoro counter anions of perfluorooctanesulfonate, perfluorononanesulfonate and the like.

Other known PAGs also may be employed in the resists of the invention. For example, N-sulfonyloxyirnides may be employed such as those described in International application WO94/10608, or non-ionic halogenated PAGs that generate a halogen acid (e.g. HBr) upon exposure to activating radiation as described e.g. in U.S. Pat. No. 5,128,232 to Thackeray et al. and in European Patent Application Nos. 0164248 and 0232972.

A preferred optional component of resist compositions of the invention is a dye compound. Preferred dyes can enhance resolution of the patterned resist image, typically by reducing reflections and the effects thereof (e.g. notching) of the exposure radiation. Preferred dyes include substituted and unsubstituted phenothiazine, phenoxazine anthracene and anthrarobin compounds. Preferred substituents of substituted iphenothiazine, phenoxazine, anthracene and anthrarobin include e.g. halogen, $C_{1-12}$ alkyl, $C_{1-12}$ alkoxy, $C_{2-12}$ alkenyl, $C_{1-12}$ alkanoyl such as acetyl, aryl such as phenyl, etc. Copolymers of such compounds also may be used as a dye, e.g. an anthracene acrylate polymer or copolymer.

Another preferred optional additive is an added base, particularly tetrabutylammonium hydroxide (TBAH), or a lactate salt of TBAH, which can enhance resolution of a developed resist relief image. Other useful base additives will include alkyl and aryl amines and pyridines. The added base used in relatively small amounts, e.g. about 1 to 20 percent by weight relative to the photoactive component (PAG).

Photoresists of the invention also may contain other optional materials. For example, other optional additives include anti-striation agents, plasticizers, speed enhancers, etc. Such optional additives typically will be present in minor concentration in a photoresist composition except for fillers and dyes which may be present in relatively large concentrations such as, e.g. in amounts of from about 5 to 30 percent by weight of the total weight of a resist's dry components.

The compositions of the invention can be readily prepared by those skilled in the art. For example, a photoresist composition of the invention can be prepared by admixing the components of the photoresist in a suitable solvent such as, for example, ethyl lactate, a glycol ether such a 2-methoxyethyl ether (diglyme), ethylene glycol monomethyl ether, propylene glycol monomethyl ether; a Cellosolve ester such as methyl ethyl ketone; and 3-ethoxy ethyl propionate. Typically, the solids content of the composition varies between about 5 and 35 percent by weight of the total weight of the photoresist composition. The resin binder and PAG components should be present in amounts sufficient to provide a film coating layer and formation of good quality latent and relief images. See Example 2 which follows for exemplary preferred amounts of resist components.

The compositions of the invention are used in accordance with generally known procedures. The liquid coating compositions of the invention are applied to a substrate such as by spinning, dipping, roller coating or other conventional coating technique. When spin coating, the solids content of the coating solution can be adjusted to provide a desired film thickness based upon the specific spinning equipment utilized, the viscosity of the solution, the speed of the spinner and the amount of time allowed for spinning.

The resist compositions of the invention are suitably applied to substrates conventionally used in processes involving coating with photoresists. For example, the composition may be applied over silicon or silicon dioxide wafers for the production of microprocessors and other integrated circuit components. Aluminum-aluminum oxide, gallium arsenide, ceramic, quartz or copper substrates also may be employed. Substrates used for liquid crystal display and other flat panel display applications are also suitably employed, e.g. glass substrates, indium tin oxide coated substrates and the like.

Following coating of the photoresist onto a surface, it is dried by heating to remove the solvent until preferably the photoresist coating is tack free. Thereafter, it is imaged through a mask in conventional manner. The exposure is sufficient to effectively activate the photoactive component of the photoresist system to produce a patterned image in the resist coating layer and, more specifically, the exposure energy typically ranges from about 1 to 300 $mJ/cm^2$, dependent upon the exposure tool and the components of the photoresist composition.

Coating layers of the resist compositions of the invention are preferably photoactivated by an exposure wavelength in the deep UV range i.e., 350 nm or less, more typically in the range of about 300 nm or less, typically about 150 to 300 or 450 nm. A particularly preferred exposure wavelength is about 248 nm.

Following exposure, the film layer of the composition is preferably baked at temperatures ranging from about 70° C. to about 150° C. Thereafter, the film is developed. The exposed resist film is rendered positive working by employing a polar developer, preferably an aqueous based developer such as an inorganic alkali exemplified by sodium hydroxide, potassium hydroxide, sodium carbonate, sodium bicarbonate, sodium silicate, sodium metasilicate, quaternary ammonium hydroxide solutions such as a tetra-alkyl ammonium hydroxide solution; various amine solutions such as ethyl amine, n-propyl amine, diethyl amine, di-n-propyl amine, triethyl amine, or methyldiethyl amine; alcohol amines such as diethanol amine or triethanol amine; cyclic amines such as pyrrole, pyridine, etc. In general, development is in accordance with art recognized procedures.

Following development of the photoresist coating over the substrate, the developed substrate may be selectively processed on those areas bared of resist, for example by chemically etching or plating substrate areas bared of resist in accordance with procedures known in the art. For the manufacture of microelectronic substrates, e.g., the manufacture of silicon dioxide wafers, suitable etchants include a gas etchant, e.g. a chlorine or fluorine-based etchant such as $CF_4$ or $CF_4/CHF_3$ etchant applied as a plasma stream. As discussed above, the compositions of the invention are highly resistant to such etchants thereby enabling manufacture of highly resolved features, including lines with sub-micron widths. See also the results of Example 9 which follows. After such processing, resist may be removed from the processed substrate using known stripping procedures.

All documents mentioned herein are fully incorporated herein by reference. The following non-limiting examples are illustrative of the invention.

EXAMPLE 1

Synthesis of a Preferred Polymer of the Invention (Polymer Having Units of para-hydroxystyrene/meta-hydroxystyrene/t-butyl acrylate)

To a clean, dry, 2-neck, round bottomed flask were added 1.318 g (8.026 mmols) of AIBN initiator, 7.69 g (59.99 mmols) of t-butyl acrylate, 45.41 g (279.98 mmols) of meta-acetoxystyrene, 9.73 g (59.99 mmols) of para-acetoxystyrene followed by 140 mL of 2-propanol and 26 mL of acetonitrile. Thus, the monomer molar charge was 15/70/15 of para-hydroxystyrene/meta-hydroxystyrene/t-butyl acrylate. The mixture was gently stirred with a magnetic stirbar and then degassed for 15–20 minutes by inserting a $N_2$ needle under the solution surface. The homogeneous solution was brought to a gentle reflux and maintained such for 20 hours. A solution of 52.5 g (681.1 mmols) of ammonium acetate in 27 mL of d.i. $H_2O$ was added dropwise to the refluxing solution and this produced a hazy mixture. The reflux was continued and in 30 minutes, the solution was clear and the reflux maintained overnight. The viscous polymer solution was cooled and transferred to a bottle containing 90 g (430 meq. —$SO_3H$) IRN-77 (washed and prepared), rolled for two hours and filtered. The copolymer was isolated by adding the polymer solution dropwise to rapidly stirred d.i. $H_2O$ (2700 mL). The wet cake was air-dried overnight and then dried in a vacuum oven at 70° C. for 20 hours to yield 46 g (94.8%) product. GPC displayed a $M_w$=15782, $M_n$=8573. $T_g$=152° C. (second heat at 20° C./min.), residual base=0.006 meq./g. Composition of para-hydroxystyrene/meta-hydroxystyrene/t-butyl acrylate=15/73/12 (molar amounts of respective units of the polymer based on NMR analysis).

EXAMPLE 2

Photoresist Preparation and Lithographic Processing

A photoresist of the invention (referred to below as Resist One) was prepared by admixing the following components in the specified amounts:

| Component | Amount |
| --- | --- |
| Resin binder<br>Terpolymer (para-hydroxystyrene/meta-hydroxystyrene/t-butyl acrylate = 15/73/12; copolymer of Example 1 above) | formulated to 20 wt. % in solvent |
| Photoactive Component<br>Di-t-butylphenyl iodonium camphor sulfonate | 5 wt. % relative to resin binder |
| Base additive<br>Tetrabutyl ammonium lactate | 0.40 wt. % relative to resin binder |
| Surfactant<br>Polydimethylsiloxane sold as Silwet L-7604 | 0.322 grams |
| Solvent<br>Ethyl lactate | 40.183 grams |

Resist One was lithographically tested. The lithographic processing was performed on modem wafer-processing tools (manufactured by FSI and SVG Companies) using both 150 mm and 200 mm silicon wafers. All processing was done in an essentially base-contaminant free atmosphere (<5 ppb measure amines/ammonia). The wafers were coated with an organic ARC composition prior to subsequent processing. Resist One was spun onto the wafers at about 3000 rpm and baked at 130° C. for 60 seconds (PAB, post-apply bake) on a 150 μm proximity-gap plate and then rapidly cooled to room temperature. Then the film was exposed using a resolution-test pattern on a DUV Stepper (248 nm). Immediately afterwards, the film was baked at 130° C. for 90 seconds (PEB, post-exposure bake) on a 150 μm proximity-gap plate, and then rapidly cooled to room temperature. Immediately afterwards the film was developed using a 45 second track-single-puddle process with 0.26 N tetramethylammonium hydroxide developer. High resolution resist relief images were obtained as shown by scanning electron microscopic analysis.

EXAMPLES 3–11

By similar procedures as disclosed in Example 1, the following nine additional polymers were synthesized. Composition and other characteristics of these copolymers are set forth in Table 1 below. The copolymers of these Examples, 3–11 consisted solely of polymerized units of para-hydroxystyrene (pHS), meta-hydroxystyrene (mHS) and tert-butylacrylate (tBA), with the molar percent as determined by $C^{13}$-NMR of each of those units specified in Table 1.

TABLE 1

| Copolymer of Ex. No. | pHS | mHS | tBA | Mw | Tg (° C.) |
| --- | --- | --- | --- | --- | --- |
| 3 | 10 | 70 | 20 | 9937 | 143 |
| 4 | 15 | 65 | 20 | 10068 | 145 |
| 5 | 31 | 53 | 16 | 26417 | 157 |
| 6 | 12 | 71 | 17 | 16037 | 149 |
| 7 | 11 | 74 | 15 | 25429 | 151 |
| 8 | 15 | 73 | 12 | 15782 | 152 |
| 9 | 21 | 71 | 8 | 16340 | 154 |
| 10 | 11 | 81 | 8 | 26827 | 153 |
| 11 | 21 | 63 | 16 | 25575 | 152 |

Dissolution rates of coating layers of the above copolymers in aqueous tetramethylammonium hydroxide solutions decreased with increasing Mw of the copolymers. Such dissolution rates also decreased with copolymers that had increased molar amounts of mHS units.

The foregoing description of the invention is merely illustrative thereof, and it is understood that variations and modifications can be effected without departing from the scope or spirit of the invention as set forth in the following claims.

What is claimed:

1. A positive-acting photoresist composition comprising a photoacid generator compound and a polymer represented by the following formula:

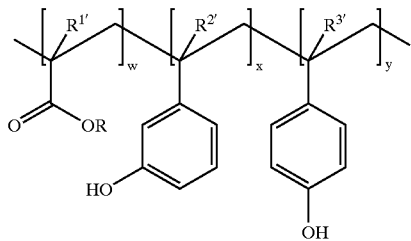

wherein R is tert-butyl;

$R^{1'}$, $R^{2'}$ and $R^{3'}$ are each independently hydrogen or methyl;

w, x, and y are each greater than 0 and are mole percents of the respective units of the polymer and the sum of w, x and y is 100 percent, and w is 5 to 25 mole percent.

2. The photoresist composition of claim 1 wherein x is greater than y.

3. The photoresist composition of claim 1 wherein x is 50 to 85 mole percent and y is 8 to 35 mole percent.

4. The photoresist composition of claim 1 wherein $R^{1'}$ and $R^{2'}$ are each hydrogen.

5. The photoresist composition of claim 1 wherein w is 8 to 20 mole percent; x is 60 to 75 mole percent; and y is 10 to 25 mole percent.

6. The photoresist composition of claim 1 wherein w is 8 to 20 mole percent; x is 60 to 70 mole percent; and y is 10 to 20 mole percent.

7. The photoresist composition of claim 1 wherein the polymer has a molecular weight distribution of 3 or less.

8. The photoresist composition of claim 1 wherein the polymer has a molecular weight distribution of 2 or less.

9. The photoresist composition of claim 1 wherein the polymer has a weight average molecular weight of 5,000 to 25,000.

10. The photoresist composition of claim 1 wherein the photoresist composition consists essentially of the polymer and the photoacid generator.

* * * * *